US009130099B2

(12) United States Patent
Robin

(10) Patent No.: US 9,130,099 B2
(45) Date of Patent: Sep. 8, 2015

(54) SEMICONDUCTOR STRUCTURE FOR EMITTING LIGHT, AND METHOD FOR MANUFACTURING SUCH A STRUCTURE

(75) Inventor: Ivan-Christophe Robin, Grenoble (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 14/122,851

(22) PCT Filed: May 29, 2012

(86) PCT No.: PCT/EP2012/060011
§ 371 (c)(1),
(2), (4) Date: Nov. 27, 2013

(87) PCT Pub. No.: WO2012/163899
PCT Pub. Date: Dec. 6, 2012

(65) Prior Publication Data
US 2014/0097401 A1  Apr. 10, 2014

(30) Foreign Application Priority Data

Jun. 1, 2011  (FR) ...................... 11 54844

(51) Int. Cl.
*H01L 33/06* (2010.01)
*H01L 33/42* (2010.01)
(Continued)

(52) U.S. Cl.
CPC ................ *H01L 33/06* (2013.01); *H01L 33/38* (2013.01); *H01L 33/385* (2013.01); *H01L 33/42* (2013.01); *H01L 33/28* (2013.01); *H01L 33/32* (2013.01)

(58) Field of Classification Search
CPC ................................ H01L 33/06; H01L 33/42

USPC .......... 257/13, 99, 79, 43, 88; 438/29, 46, 47, 438/597, 22, 608
See application file for complete search history.

(56) References Cited

U.S. PATENT DOCUMENTS

2008/0224115 A1* 9/2008 Bakkers et al. .................... 257/1
2009/0267049 A1* 10/2009 Cho et al. ......................... 257/13
(Continued)

FOREIGN PATENT DOCUMENTS

EP    1 791 186    5/2007
FR    2 934 716    2/2010
(Continued)

OTHER PUBLICATIONS

S. J. Jiao, et al. "ZnO p-n junction light-emitting diodes fabricated on sapphire substrates" Applied Physics Letters, vol. 88, 2006, pp. 031911-031913.
(Continued)

*Primary Examiner* — Sheng Zhu
(74) *Attorney, Agent, or Firm* — Oblon, McClelland, Maier & Neustadt, L.L.P.

(57) ABSTRACT

A semiconductor structure for emitting light including a substrate made of a first semi-conductor material having a first type of conductivity, a first electrical contact, a second semiconductor material, having a second type of conductivity to form a junction, a second electrical contact contacting the second semiconductor material, a polarizer configured to polarize at least one portion of the semiconductor structure, and a plurality of micro- or nano-structures each including a first end connected to the substrate. Each micro- or nano-structure includes at least one portion made from the second semiconductor material, or each micro- or nano-structure having the first type of conductivity, a second end contacting the second semiconductor material to form the junction.

22 Claims, 10 Drawing Sheets

(51) Int. Cl.
*H01L 33/38* (2010.01)
*H01L 33/28* (2010.01)
*H01L 33/32* (2010.01)

(56) References Cited

U.S. PATENT DOCUMENTS

| | | |
|---|---|---|
| 2010/0025654 A1* | 2/2010 | Robin et al. .................. 257/13 |
| 2010/0025673 A1 | 2/2010 | Hu et al. |
| 2010/0283064 A1* | 11/2010 | Samuelson et al. ............ 257/88 |
| 2011/0089400 A1 | 4/2011 | Ohlsson et al. |
| 2011/0240959 A1 | 10/2011 | Konsek et al. |

FOREIGN PATENT DOCUMENTS

| | | |
|---|---|---|
| WO | 2009 128777 | 10/2009 |
| WO | 2010 071594 | 6/2010 |

OTHER PUBLICATIONS

Hiromichi Ohta, et al., "Fabrication and photoresponse of a *pn*-heterojunction diode composed of transparent oxide semiconductors, *p*—NiO and *n*—ZnO", Applied Physics Letters, vol. 83, No. 5, Aug. 4, 2003, pp. 1029-1031.

I. C. Robin, et al., "Evidence for low density of nonradiative defects in ZnO nanowires grown by metal organic vapor-phase epitaxy", Applied Physics Letters, vol. 91, 2007, pp. 143120-1 to 143120-3.

U.S. Appl. No. 14/467,398, filed Aug. 25, 2014, Robin, et al.

International Search Report Issued Jul. 5, 2012 in PCT/EP12/060011 Filed May 29, 2012.

* cited by examiner

SEMICONDUCTOR STRUCTURE FOR EMITTING LIGHT, AND METHOD FOR MANUFACTURING SUCH A STRUCTURE

TECHNICAL FIELD

The invention pertains to the field of the supply of light emission means and more particularly to the field of the supply of light emission means in the ultraviolet (acronym UV) range.

Over the last twenty years, the semiconductor industry has demonstrated and developed the strong potential of semiconductor structures for the emission of light in wavelength ranges extending from the infrared to the visible range.

On account of technological limits linked to semiconductor materials, the potential of semiconductor structures for the emission of light in wavelengths ranging from the near UV to the deep UV still has to be demonstrated.

The invention more particularly relates to a semiconductor structure intended to emit light and to the method for manufacturing such a semiconductor structure.

PRIOR ART

Over recent years, different avenues have been explored with the aim of developing semiconductor structures intended to emit light in UV wavelength ranges.

A first avenue relates to semiconductor structures based on a semiconductor junction (generally known under the denomination p-n junction) based on wide band gap semiconductors with direct band gap, such as zinc oxide (ZnO), gallium nitride (GaN). In fact, according to one principle, identical to that used to make semiconductor structures intended to emit light in the visible wavelengths, the layout of a zone favourable to the recombination of electron-hole pairs in a semiconductor junction directly polarized from a wide band gap material with direct band gap should enable an emission of photons in UV wavelengths. Thus, for a junction based on ZnO [1], in which the forbidden gap is of a value of 3.37 eV, it is possible to attain a wavelength of around 370 nm.

Nevertheless, the exploitation of this type of semiconductor junction remains limited by the existing doping problems for semiconductor materials with wide band gap. In fact, the activation energy of the dopants of such materials is often of the same order of magnitude or of a value greater than the thermal energy at ambient temperature for at least one of the two conductivity types.

In response to this problem and according to a similar principle, the use of heterojunctions [2] has also been envisaged. Nevertheless, this type of heterojunction has a problem linked to the interface quality of such a heterojunction, interface defects creating non-radiative recombination traps which limit the emission efficiency of semiconductor structures having such a heterojunction.

To circumvent this limit, J. Simon and his collaborators have recently proposed [3] using an electric field internal to the semiconductor structure to inject minority carriers at the level of one of the two zones forming the junction. In these works, the electric field is generated by the combined use of the band gap difference between aluminium gallium nitride (AlGaN) and gallium nitride (GaN), and of a gradation in the aluminium composition at the level of the junction. The electric field thereby generated enables the injection of minority carriers which favours in turn electron-hole recombinations underlying the emission of light. Similarly, this gradation makes it possible to limit interface defects linked to the heterojunction, this interface being gradual.

Although these works show the high potential of the injection of carriers linked to an electric field, the industrial feasibility still has to be demonstrated.

Another solution, described in the French patent FR 2934716, consists in generating an external electric field to obtain an inversion zone of the carrier type in one of the two zones of the junction. This inversion of carriers is obtained by the use of a polarization gate of the zone to be inversed, which is adapted so that its polarization leads to an injection of majority carriers of the other zone into said zone. Such an inversion of carriers makes it possible to create in this same zone a region favourable to the recombination of carriers and thus to the emission of light, this region forming a "quasi-junction" semiconductor. It then ensues that even for a low doping of the non-inversed zone, the region favourable to the emission is only limited by the polarized zone. In addition, this region may be, by the polarization, moved away from the junction and the non-radiative recombination traps which can be found there in the case of a heterojunction.

Quasi-junction above is taken to mean a semiconductor junction formed by the creation in a material having a single type of conductivity of a zone of a type of conductivity opposite to it, for example, by injection of minority carriers into said zone.

Nevertheless, with the planar configuration proposed in said patent, the emitting region remains limited by the zones polarized by the gate, itself limited by the geometry of the anode and the cathode, and thus does not make it possible to obtain a large emission surface and thus a high emission power without combining a large number of semiconductor structures together.

DESCRIPTION OF THE INVENTION

One of the aims of the invention is to provide a semiconductor structure intended to emit light with use of an external electric field at the junction to inject minority carriers into a portion of the semiconductor structure and thereby to inverse at least partially the type of conductivity, said structure having a configuration enabling an optimisation of the injection of minority carriers into said portion so as to enable an improvement in emission efficiency compared to a layout of the prior art.

The invention has more precisely the aim of providing a semiconductor structure intended to emit light and which comprises a first and a second portion in contact with each other so as to form a semiconductor junction, said junction being unsuitable for emitting light in an efficient manner, on account of problems linked to the technique of doping the material(s) constituting the structure or of a high concentration of crystalline defects at the level of said junction, said structure further comprising a polarization means adapted to inverse the type of carriers in one of the portions by injection into said portion majority carriers of the other portion, so as to move the junction in said portion, said structure being configured so as to have an emission surface greater than a prior structure comprising such a polarization means.

To this end, the invention relates to a semiconductor structure for emitting light comprising:
- a substrate made of a first semi-conductor material having a first type of conductivity, the substrate having a first and a second face,
- a first electrical contact on the first face,
- at least one second semiconductor material having a second type of conductivity forming a first portion of the semiconductor structure and in electrical contact with a second portion of the semiconductor structure having the first conductivity so as to form a junction, a second electrical contact electrically connected with the second semiconductor material, a polarization means suitable for polarizing at least a portion of the semiconductor structure among the first and the second portion, the polarization means being laid out so that its polarization leads to an inversion of the type of carriers in said portion by injection into said portion majority carriers of the other portion, so as to move the junction in said portion, the semiconductor structure comprising:

a plurality of semiconductor micro- or nano-structures each having a first and a second end, each of the first ends being connected to the second face, each micro- or nano-structure comprising at least one portion made from the second semiconductor material so as to form the first portion, or each micro- or nano-structure having the first conductivity, the second end contacting the second semiconductor material so as to form the junction, and each micro- or nano-structure comprises a part of said micro- or nano-structure in which the type of carriers is intended to be inversed by the polarization means.

Hereafter, and in the remainder of this document, a first type of conductivity and a second type of conductivity are taken to mean conductivities corresponding respectively to a first type of majority carrier being able to be chosen from the group comprising electrons and holes, and to a second type of different majority carriers chosen from this same group.

Above and in the remainder of this document, semiconductor junction is taken to mean a transition zone between semiconductor regions of different electrical properties, such a zone being characterised by the existence of a potential barrier. Such a semiconductor structure enables an inversion of the type of carriers at the level of the second face and/or of the plurality of nanostructures in a 3D manner, since each micro- or nano-structure has at least one portion of the first and second portion of the structure forming the junction, thereby significantly increasing the zone wherein the type of carriers is inversed and thus wherein the recombinations of the electron-hole pairs may take place. In fact, when the polarization means are polarized, the "quasi-junction" is thus formed in at least one portion of each of the micro- or nano-structures and may, according to the configuration, also extend along the second face of the substrate. With such a "quasi-junction", one thus optimises the zones in which radiative electron-hole pair recombinations can take place and thus light emission zones.

The polarization means may comprise an insulator layer contacting the portion of the semiconductor structure to be polarized and a conductor layer on said insulator layer.

Such an insulator layer on which is deposited a conductor layer makes it possible to provide a means of polarizing at least one portion of the homogeneous semiconductor structure since provided by a conductor layer present on an insulator layer contacting said portion of the semiconductor structure.

The insulator layer may be contacting the zones of the second face left free by the micro- or nano-structures and on at least one portion of each micro- or nano-structure.

Such an insulator layer may enable a polarization of the whole of the portion of the semiconductor structure to be polarized without risk of short-circuit, the conductor layer being able to be deposited on this insulator layer without risk of short-circuit with said portion of the semiconductor structure.

Such an arrangement of the insulator layer also enables, with a suitable configuration of micro- and nano-structures, a polarization of the portion in which the type of carriers is non-inversed, thereby facilitating the injection of minority carriers into the portion to be inversed.

The conductor layer may be adapted to be at least partially transparent to the wavelength at which the semiconductor structure is intended to emit.

Thus, the light emitted may be transmitted through the conductor layer.

The conductor layer may be advantageously indium tin oxide (ITO), a metal of low thickness, so as to make it at least partially transparent to the emission wavelength of the semiconductor structure or a semiconductor transparent at the emission wavelength of the semiconductor structure and having a high doping so as to make it degenerated and thus conductor.

The insulator layer may be made of a material selected from the group comprising silicon dioxide ($SiO_2$) and "high-k" dielectrics, such as hafnium dioxide ($HfO_2$).

The deposition of such materials being perfectly mastered in the silicon based semiconductor industry, these materials make it possible to provide an insulator layer having the necessary insulation for the polarization of the zone to be inversed without having the risks of leaks inherent in a non-controlled insulator layer.

Each micro- or nano-structure may have at least one reduced dimension along one of the directions substantially parallel to the second face so as to form a 2D, preferentially 1D, micro- or nano-structure.

2D, or 1D, micro- or nano-structure is taken to mean a micro- or nano-structure in which one dimension, or two dimensions, is less than or of the same order of magnitude as the corresponding electronic mean free path from the or to the materials composing said micro- or nano-structure Such a reduced dimension enables both a quantum confinement and an optimisation of the region of the substrate that is influenced by the inversion of the type of carriers, while limiting the shade zones linked to the presence of micro- or nano-structures, said shade zones only being on this reduced dimension.

Each micro or nano-structure may be a semiconductor nanowire.

Such micro- or nano-structures may be easily obtained in one go by epitaxial growth on the whole substrate surface, thereby limiting the number of manufacturing steps and thus the supply costs of a semiconductor structure according to the invention.

According to a first embodiment, each micro- or nano-structure may have a conductivity of the same type as that of the first semi-conductor material so as to form the second portion, the second end of each of the micro- or nano-structures contacting the second semiconductor material.

Such micro- or nano-structures may be obtained in a single growth step, thereby limiting the steps necessary for the provision of a semiconductor structure according to the invention.

According to another embodiment, each micro or nano-structure may have:
a first portion comprising the first end, and having a conductivity of the same type as that of the first semi-conductor material, so as to form the second portion, and
a second portion comprising the second end, and being made from the second semiconductor material so as to form the first portion.

Such a configuration of each of the micro- or nano-structures makes it possible to provide a semiconductor structure having the junction at the level of the micro- or nano-structures thereby making it possible, for a suitable polarization means, to polarize both the portion to be inversed and the non-inversed portion of each of the micro- or nano-structures. In fact, such a configuration enables the optimisation of the injection of minority carriers into the zone to be inversed.

According to another form of embodiment, each micro- or nano-structure may be entirely made from the second semiconductor material so as to form the first portion.

Thus, the structure has the junction closest to the surface of the substrate thereby enabling an optimised inversion of the type of carriers at the level of the second face.

Each micro- or nano-structure may comprise a fraction of a layer known as wetting layer contacting the substrate, this fraction of wetting layer forming the first end of said micro- or nano-structure.

With such a wetting layer, the portion to be inversed is formed by micro- or nano-structures, the inversion of the type of carriers may thus take place over the whole of each of the micro- or nano-structures, the wetting layer included.

According to a possibility of the invention, at least one portion of the nanowire may comprise a conformation of the "core-shell" type, in other words that the portion of the nanowire is constituted of at least two semiconductor materials, one, known as core material, forming the centre of said portion of the nanowire and the other, known as shell material, surrounding the core material so as to form the exterior contour of the portion of nanowire.

Such a conformation enables a portion of nanowire, preferentially chosen as that being comprised in the portion to be inversed of the semiconductor structure, of having a better quantum confinement in the core material with an interface between the core material and the shell material having a low density of non-radiative traps, thereby increasing the emission efficiency of such as nanowire.

The nanowire may have a single portion of nanowire comprising a "core-shell" conformation, said portion of nanowire being a portion selected from the group comprising the first portion and the second portion.

The junction may be a heterojunction.

Such a junction makes it possible to use the qualities of a semiconductor material having a suitable band gap to emit at the chosen wavelength without requiring that this same material has the possibility of having the two types of conductivity to form the junction.

The portion of the semiconductor structure of the first and of the second portion having a conductivity in which the majority carriers are electrons may be made of a semiconductor material having an n type doping, said semiconductor material being preferentially selected from the group comprising zinc oxide (ZnO), zinc manganese oxide (ZnMgO), gallium nitride (GaN), and aluminium gallium nitride (AlGaN).

Such semiconductor materials enable, through the energy of their forbidden band and the fact that they have a direct band gap, an emission in the UV range.

The portion of the semiconductor structure of the first and of the second portion having a conductivity in which majority carriers are holes may be made of a semiconductor material having a p type doping, said semiconductor material being preferentially selected from the group comprising gallium nitride (GaN), zinc selenide (ZnSe) and zinc telluride (ZnTe).

Such semiconductor materials enable, through the energy of their forbidden band and the fact that they have a direct band gap, an emission in the UV range.

The invention also relates to a method for manufacturing a semiconductor structure according to the invention, said method for manufacturing comprising the steps consisting in:
  providing a substrate made of a first semi-conductor material having a first type of conductivity, said substrate having a first and a second face
  forming a first electrical contact on the first face,
  forming a plurality of micro- or nano-structures on the second face, each of the micro- or nano-structures having a first and a second end with each of the first ends connected to the second face, each micro- or nano-structure comprising at least one portion made of a second semiconductor material having, or able to have by the action of a doping material, a conductivity of a second type so as to form a first portion of the semiconductor structure with the substrate and/or another portion of each of the micro- or nano-structures forming a second portion of the semiconductor structure, or each micro- or nano-structure having the first type of conductivity and forming at least partially a second portion of the semiconductor structure,
  forming a polarization means suitable for polarizing at least one portion among the first and the second portion, the polarization means being laid out so that its polarization leads to an inversion of the type of carriers in said portion,
  depositing, if each micro- or nano-structure has the first type of conductivity and forms at least partially the second portion of the structure, a second semiconductor material so as to form a first portion of the semiconductor structure,
  forming a second electrical contact contacting the second semiconductor material.

Such a method enables the formation of a semiconductor structure able to emit in an optimised manner light in UV wavelengths, the contact between the first and the second portion enabling the formation of the junction.

According to a possibility of the invention, the method may be a method for manufacturing a semiconductor structure in which the polarization means comprise an insulator layer contacting the portion of the semiconductor structure to be polarized and a conductor layer on said insulator layer, the step consisting in forming a polarization means comprising the steps consisting in:
  depositing an insulator layer on the zones of the second face left free by the micro- or nano-structures and on at least one portion of the micro- or nano-structures,
  depositing a conductor layer on the insulator layer.

Such a method makes it possible to provide a semiconductor structure with a polarization means providing a homogeneous polarization over the whole portion of the semiconductor structure to be polarized.

The method may comprise after the step consisting in forming a polarization means and before the step consisting in forming the second electrical contact, the steps further consisting in:
  Eliminating the part of the insulator layer and the conductor layer present on each of the micro- or nano-structures at the level of their second end and at least at the level of the circumference near to the second end on each of the micro- or nano-structures,
  depositing a filling material so that the space between the micro- or nano-structures is at least partially filled and that each of the micro- or nano-structures has at least one covered portion.

Such steps enable the deposition of a filling material, said filling material enabling the provision of a support for the deposition of another material, such as a doping material or the second semiconductor material.

According to a possibility of the invention, the deposition of filling material may be carried out so that the space between the micro- or nano-structures is totally filled, the second end of each of the micro- or nano-structures being flush with the filling material.

According to a variant of the invention, the method of manufacture may be for the manufacture of a semiconductor structure wherein each micro or nano-structure has:
- a first portion comprising the first end, and having a conductivity of the same type as that of the first semiconductor material so as to form the second portion,
- a second portion comprising the second end, and being made from the second semiconductor material so as to form the first portion, the method comprising, after the step consisting in forming a polarization means and before the step consisting in forming the second electrical contact, the steps consisting in:
- depositing a filling layer so that the space between the micro- or nano-structure is filled and so that a first portion of each of the micro- or nano-structures is covered and that a second portion of each of the micro- or nano-structures extends beyond said filling layer,
- eliminating the part of the conductor layer and the insulator layer of the second portion of each of the micro- or nano-structures,
- depositing a layer of doping material, such as a polymer containing doping ions, said layer being deposited so that the second end of each of the micro- or nano-structures is flush,
- carrying out an activation of the layer of doping material so as to enable the doping of the second portion of each of the micro- or nano-structures.

Such steps enable the supply of a structure in which at least one portion of each of the micro- or nano-structures is doped by a doping material.

BRIEF DESCRIPTION OF DRAWINGS

The present invention will be better understood on reading the description of embodiment examples, given purely by way of indication and in no way limiting, while referring to the appended drawings in which.

The different parts represented in the figures are not necessary shown according to a uniform scale in order to make the figures more legible.

The different possibilities (variants and embodiments) should be understood as not being mutually exclusive and may be combined together.

DETAILED DESCRIPTION OF PARTICULAR EMBODIMENTS

Figure 1:
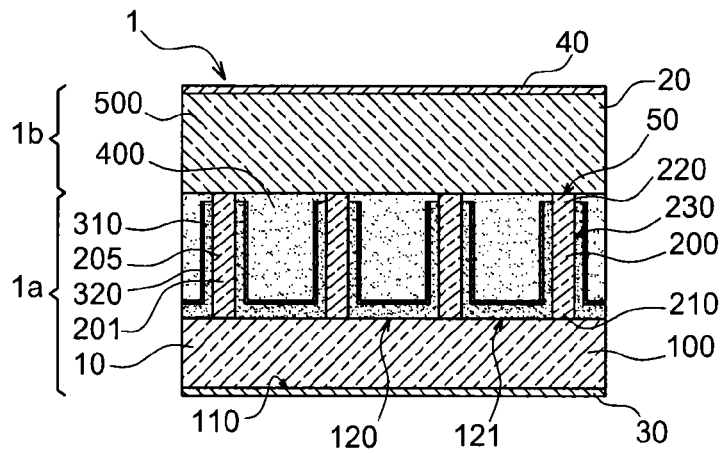
FIG. 1 illustrates a first embodiment of a semiconductor structure according to the invention, said semiconductor structure comprising nanowires having the same type of conductivity as the substrate, FIGS. 2 a) to d) illustrate the method of manufacture and emission of a semiconductor structure according to the first embodiment.

FIG. 1 is a schematic view in transversal section illustrating a first embodiment of a semiconductor structure 1 according to the invention.

Such a semiconductor structure 1 is a semiconductor structure 1 intended to emit light. Such a semiconductor structure 1 is more particularly adapted to emit in wavelengths of the near UV and the deep UV.

A semiconductor structure according to this first embodiment 1 comprises:
- a semiconductor substrate 100 made of a first semi-conductor material 10 having a conductivity in which the majority carriers are electrons, in other words of n type, the semiconductor substrate 100 having a first and a second face 110, 120,
- a first electrical contact 30 on the first face 110,
- a plurality of nanowires 200 connected to the second face 120, said nanowires 200 having the same type of conductivity as the semiconductor substrate 100, each of the nanowires 200 comprising a first and second end 210, 220,
- an insulator layer 310 contacting the zones 121 of the second face 120 left free by the nanowires 200 and with a portion of the circumference 230 of the nanowires 200,
- a metal layer 320 contacting the insulator layer 310 and without contacting the nanowires 200,
- a filling material 400 filling the space between the nanowires 200,
- a layer 500 of a second semiconductor material 20 having a conductivity in which the majority carriers are holes, in other words of p type, said layer 500 contacting the second end 220 of each of the nanowires 200 so as to form a semiconductor junction 50, a second electrical contact 40 contacting the layer 500 of the second semiconductor material 20.

The substrate 100 is a semiconductor substrate conventionally used to make emitting structures and being able to have a conduction of n type.

For the envisaged applications, the first semi-conductor material 10 forming the semiconductor substrate 100 is preferentially a semiconductor known as wide band gap. Wide band gap is taken to mean that the semiconductor material has a forbidden band energy greater than 1.5 eV.

Thus, the first semi-conductor material 10 may be made of gallium nitride (GaN), aluminium gallium nitride (AlGaN) or instead gallium arsenide (GaAs). So that the semiconductor substrate 100 has n conductivity, the first semi-conductor material 10 is n doped.

The first electrical contact 30 is preferentially an electrical contact of n type so as to limit the electrical resistance with the first semi-conductor material 10.

The nanowires 200 are connected to the semiconductor substrate 100 on the second face 120. Each nanowire 200 has its first end 210 contacting the second face 120.

Each of the nanowires 200 is made from a wide band gap semiconductor material 201 with direct band gap having an n type doping. Semiconductor material with direct band gap is taken to mean a semiconductor in which the maximum energy of the valence band and the minimum energy of the conduction band are situated substantially at the same value of the k wave vector in the energy dispersion diagram of said semiconductor material.

The semiconductor material 201 from which the nanowires 200 are made is adapted to the desired emission wavelength of the semiconductor structure 1. Thus, for an emission of light in the near UV wavelengths range, the semiconductor material 201 forming the nanowires 200 may be zinc oxide (ZnO) or gallium nitride (GaN). For an emission in the deep UV range, the semiconductor material 201 forming the nanowires 200 may zinc manganese oxide (ZnMgO) or aluminium gallium nitride (AlGaN).

According to a possibility of the invention, the semiconductor material 201 from which the nanowires 200 are made may be advantageously the same as the first semi-conductor material 10.

The nanowires 200 preferentially have a diameter comprised between 5 nm and 1 μm for a length comprised between 50 nm and 10 μm.

The nanowires 200 form with the second face 120 a second portion 1a of the semiconductor structure 1.

The layer of insulator material 310 covers both the zones 121 of the second face 120 left free by the nanowires 200 and a portion of the circumference 230 of the nanowires 200 while leaving free the second end 220 of each of the nanowires 200. The insulator material forming the layer of insulator material 310 may be silicon dioxide ($SiO_2$), and "high k" dielectrics, such as hafnium dioxide ($HfO_2$), for example. "High k" dielectric is taken to mean a dielectric having a dielectric constant higher than that of silicon dioxide. The layer of insulator material has a thickness comprised between 5 nm and 50 nm.

The conductor layer 320 is preferentially adapted to be transparent to the emission wavelength of the semiconductor structure 1. Thus the conductor layer 320 may be a layer of indium tin oxide (also known under the acronym ITO) or any other conducting and transparent material known to those skilled in the art.

The conductor layer 320 and the layer of insulator material 310 form a polarization means laid out so that its polarization leads to an inversion of the type of carriers in said portion (1a, 1b) by injection into said portion (1a, 1b) of majority carriers of the other portion (1b, 1a), so as to move the junction in said portion, The filling material 400 may be a dielectric material, such as silicon dioxide or a "low k" dielectric material. "Low k" dielectric is taken to mean a dielectric having a lower dielectric constant than that of silicon dioxide. This filling material 400 may be, to facilitate the method of manufacturing such a semiconductor structure 1, a material of the "Spin On Glass" type, in other words a dielectric material adapted to be deposited by means of a spin coater. In fact, the deposition by centrifugation of such a material makes it possible to easily and efficiently fill the spaces remaining vacant between the nanowires 200.

According to a not illustrated and not preferred possibility, it is also possible not to fill the space between the nanowires 200.

The second end 220 of each of the nanowires 200 is flush with the layer of filling material 400 and is contacting the second semiconductor material 20.

In this embodiment, the second semiconductor material 20 takes the form of a layer 500 contacting the second end 220 of each of the nanowires 200 so as to form the junction 50. The second semiconductor material 20 is a semiconductor material having a conductivity in which the majority carriers are holes, in other words that the second semiconductor material 20 has a p type doping.

The second semiconductor material 20 is preferentially a wide band gap semiconductor, in which the energy of the forbidden band is close to that of the semiconductor material 201 constituting the nanowires 200. Thus, the second semiconductor material 20 may be gallium nitride (GaN), zinc selenide (ZnSe) and zinc telluride (ZnTe).

The second semiconductor material 20 may be, without going beyond the scope of the invention, the same material as the semiconductor material 201 forming the nanowires 200 with a conductivity of p type, so that the junction 50 is a homojunction, or another semiconductor material, so that the junction 50 is a heterojunction.

The second semiconductor material 20 forms a first portion 1b of the semiconductor structure 1.

The second electrical contact 40 is a p type electrical contact so as to limit the electrical resistance with the second semiconductor material 20.

The method of manufacturing such a semiconductor structure 1 comprises, as illustrated in FIGS. 2 a) to c), the steps consisting in:

providing the substrate 100 made from the first semi-conductor material 10, forming, as illustrated in FIG. 2 a), a plurality of nanowires 200 on the second face 120, the first end 210 being, during this formation, contacting the second face 120, depositing the layer of insulator material 310 on the zones 121 of the second face 120 left free by the nanowires 200 and on the nanowires 200, depositing the conductor layer 320 on the layer of insulator material 310, as illustrated in FIG. 2 b), eliminating, by selective attack, such as attack with reactive ions (R.I.E.), the layer of insulator material 310 and the conductor layer 320 of the second end 220 of each of the nanowires 200 and on a portion of the circumference 230 of each of the nanowires 200 near to the second end 220, depositing, for example by centrifugation if the filling material is a material of "spin on glass" type, the filling material 400 so that the second end 220 of each of the nanowires 200 flush with the surface of the filling material is flat, depositing a layer of the second semiconductor material 20 so as to form the junction 50, forming the first electrical contact 30 contacting the first face 110, forming a second electrical contact 40 contacting the second semiconductor material 20 to thereby obtain the semiconductor structure illustrated in FIG. 2 c).

The step of forming nanowires 200 being moreover known, such as in the articles of I. C. Robin and his collaborators [4-5], this step is not described in this document.

In this method of manufacture, portion of the circumference 230 of each of the nanowires 200 near to the second end 220 is taken to mean the portion of the circumference of each of the nanowires 200 which is at a predefined distance from the second end 220, this predefined distance being comprised between 5 nm and 150 nm, with a preferred value substantially equal to 10 nm.

Once formed, the semiconductor structure 1 is able to emit light of which the wavelength is defined by the material 201 of the nanowires 200.

This emission, illustrated in FIG. 2 d), is obtained by a polarization of the junction 50 directly, in other words that the second electrical contact 40 is polarized positively relatively to the first electrical contact 30. This polarization may have a value comprised between 1V and 30V, this value having to be adapted to the semiconductor materials 10, 20, 201 constituting the semiconductor structure 1. To optimise the emission efficiency of the semiconductor structure 1, the conductor layer 320 is polarized negatively relatively to the first electrical contact 30. This polarization may have a −V value comprised between −1V and −30V, this value having to be adapted to the semiconductor material 201 constituting the nanowires.

Figure 2A:
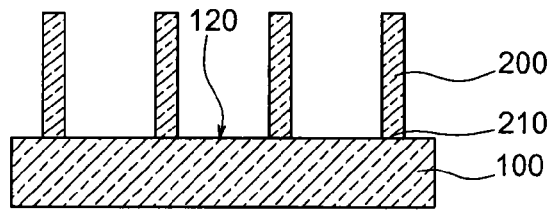
Figure 2B:
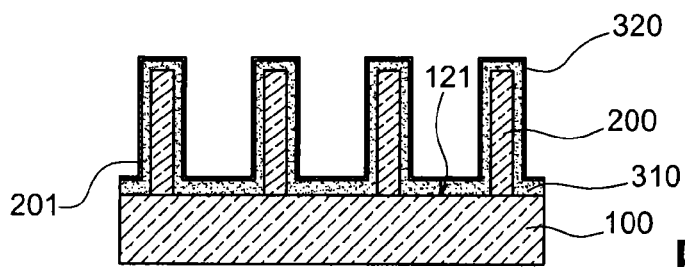
Figure 2C:
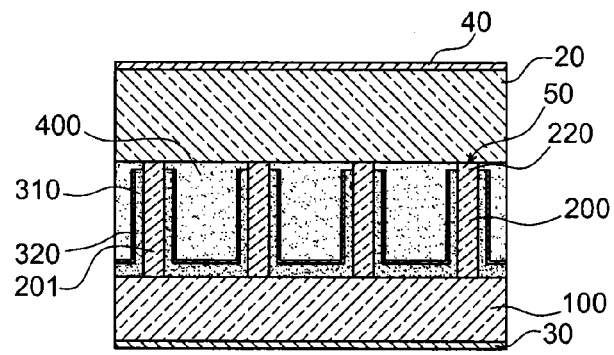
Figure 2D:
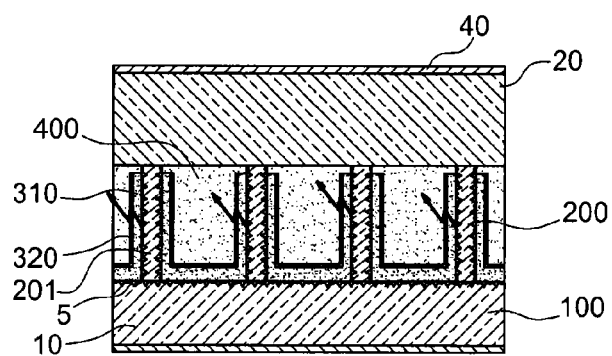

In this way, and in a manner identical to the semiconductor structure 1 described in the document FR 2934716, the polarization of the electric layer 320 makes it possible, if it is sufficient, to create an inversion 5 of the type of carriers in the second portion 1a of the semiconductor structure 1, in other words at the level of the nanowires 200 and of the second face 120. Thus, the inversion of carriers in the second portion 1a, obtained by injection of majority carriers of the first portion 2a into the first portion by means of said polarization, makes it possible to move the junction in the second zone at the level of said inversion zone while forming a "quasi-junction". This inversion zone extending over the whole length of the nanowire 200 makes it possible to create a zone favourable to electron-hole recombinations wherein the recombination of electron-hole pairs gives rise to the emission of light and thus the emission zone extends over the whole height of the nanowires 200 and at the level of the second face 120 as shown in FIG. 2d, which makes it possible to obtain a particularly important emission surface.

It may also be noted that this recombination takes place at a distance from the junction 50 between the semiconductor material 201 forming the nanowires 200 and the second semiconductor material 20, and is thus at a distance from this same interface between these two materials 201, 20 generally rich in non-radiative recombination defects thereby optimising the efficiency of the semiconductor structure 1.

Figure 3:
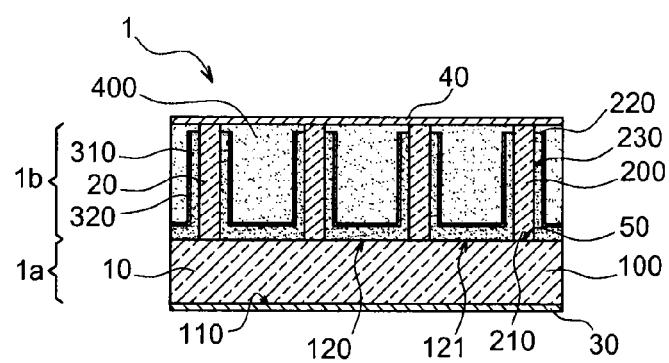
FIG. 3 illustrates a second embodiment of a semiconductor structure according to the invention, said semiconductor structure comprising nanowires having a conductivity of another type as that of the substrate, FIGS. 4 a) to d) illustrate the method of manufacture and emission of a semiconductor structure according to the second embodiment.
Figure 4A:
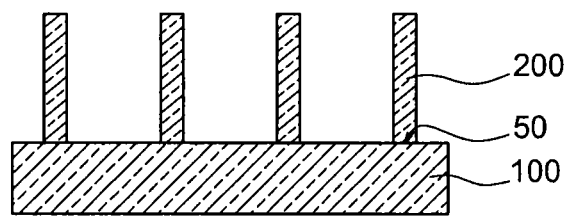
Figure 4B:
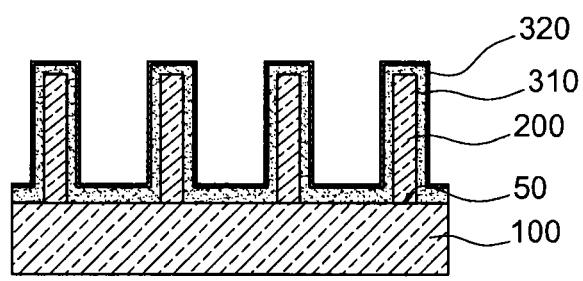
Figure 4C:
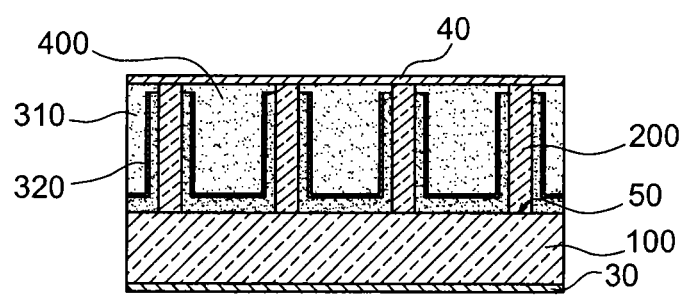
Figure 4D:
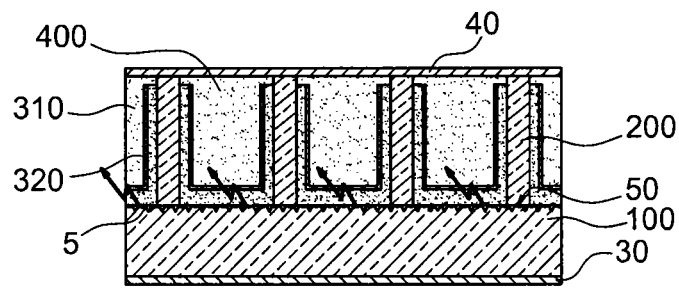

FIG. 3 is a schematic view in transversal section illustrating a second embodiment of a semiconductor structure 1 according to the invention. A semiconductor structure 1 according to this second embodiment differs from that 1 according to the first embodiment in that each nanowire 200 is entirely made from the second semiconductor material 20 so as to form the first portion 1b of the semiconductor structure 1 and in that the semiconductor structure 1 does not comprises a layer 500 of second semiconductor material 20, the second electrical contact 40 being made contacting the second end 220 of each of the nanowires 200.

In such a semiconductor structure 1, the junction 50 is present at the interface between the first end 210 of each of the nanowires 200 and the second face 120, the second face 120 forming the second portion 1a of the semiconductor structure 1.

In this embodiment, the first semi-conductor material 10 is chosen as a function of the desired emission wavelength of the semiconductor structure 1. Thus, for an emission of light in the near UV range, the first semi-conductor material 10 may be zinc oxide (ZnO) or gallium nitride (GaN). For an emission in the deep UV range, the first semi-conductor material 10 may be zinc manganese oxide (ZnMgO) or aluminium gallium nitride (AlGaN).

According to this same embodiment, the second semiconductor material 20 is preferentially a wide band gap semiconductor, in which the energy of the forbidden band is close to that of the first semi-conductor material 10.

The method of manufacturing a semiconductor structure 1 according to this embodiment, as illustrated in FIGS. 4 a) to c), differs from a method of manufacturing a semiconductor structure 1 according to the first embodiment in that it does not comprise a step consisting in depositing a layer 500 of the second semiconductor material 20 and in that the step consisting in forming a second electrical contact 40 is made contacting the second end 220 of each of the nanowires 200.

The emission of light with a semiconductor structure 1 according to the second embodiment is obtained, as illustrated in FIG. 4 d), in a similar manner to that of a semiconductor structure 1 according to the first embodiment.

Figure 5:
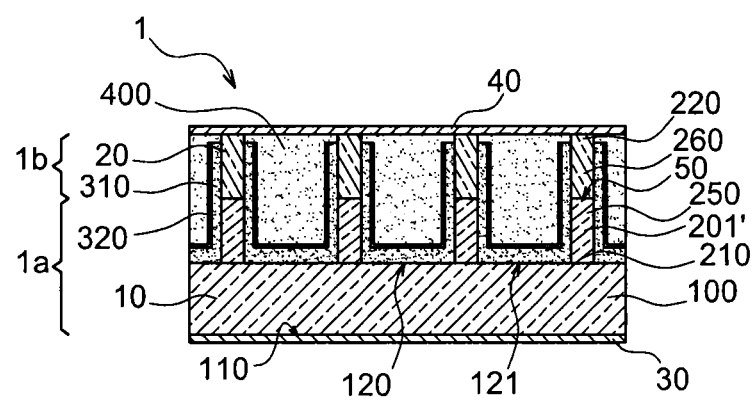
FIG. 5 illustrates a third embodiment of a semiconductor structure according to the invention, said semiconductor structure comprising nanowires having a first portion of a first type of conductivity and a portion of a second type of conductivity, the gate being present over the whole length of the nanowires, FIGS. 6 a) to d) illustrate a method of manufacture and emission of a semiconductor structure according to the third embodiment.
Figure 6A:
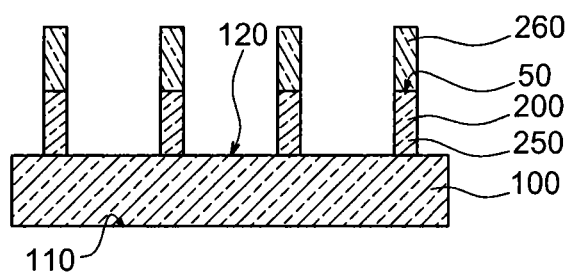
Figure 6B:
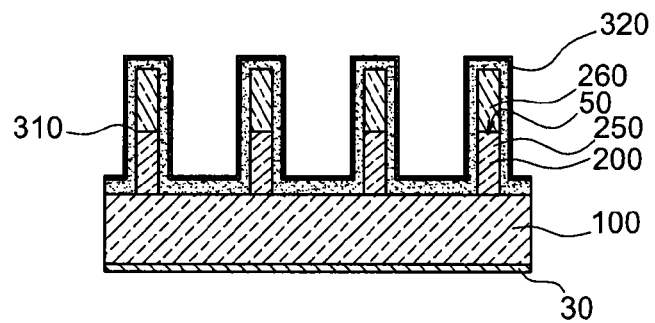
Figure 6C:
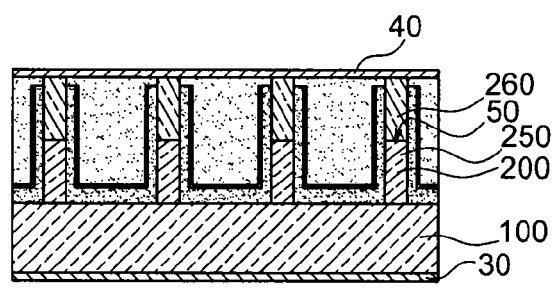
Figure 6D:
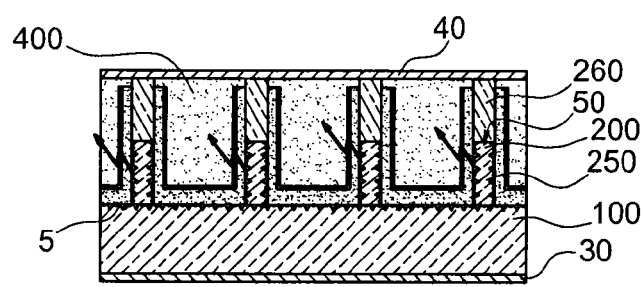

FIG. 5 illustrates a third embodiment of a semiconductor structure 1 according to the invention, such a semiconductor structure 1 differs from a semiconductor structure 1 according to the second embodiment in that each of the nanowires 200 comprises a first portion 250 made of a semiconductor material 201' of same type of conductivity as the first semi-conductor material 10 and a second portion 260 made of the second semiconductor material 20, the interface between these two portions 250, 260 forming the junction 50 of the semiconductor structure 1. According to this embodiment, the second portion 260 forms the first portion 1b of the semiconductor structure 1, the first portion 250 and the second face 120 forming the second portion 1a.

The semiconductor material 201' of the first portion 250 is a wide band gap semiconductor with direct band gap. The semiconductor material 201' of the first portion may advantageously be a material substantially identical to the first semi-conductor material 10.

The semiconductor material 201' of the first portion 250 is adapted to the desired emission wavelength of the semiconductor structure 1. Thus, for an emission of light in the near UV range, the semiconductor material 201' of the first portion 250 may be zinc oxide (ZnO) or gallium nitride (GaN). For an emission in the deep UV range, the semiconductor material 201' of the first portion 250 may be zinc manganese oxide (ZnMgO) or aluminium gallium nitride (AlGaN).

The method of manufacturing a semiconductor structure 1 according to this third embodiment, as illustrated in FIGS. 6 a) to c), differs from a method of manufacturing a semiconductor structure 1 according to the second embodiment by the step of forming the plurality of nanowires 200.

In fact, this step, to enable the formation of such a semiconductor structure 1, notably comprises a change of the material deposited during the growth of the nanowires 200, so that each of the nanowires 200 can have the first portion 250 made from the semiconductor material 201' of the first portion and the second portion 260 made from the second semiconductor material 20.

The emission of light with a semiconductor structure 1 according to the third embodiment is obtained, as illustrated in FIG. 6 d), in a similar manner to that of a semiconductor structure 1 according to the first embodiment.

Figure 7:
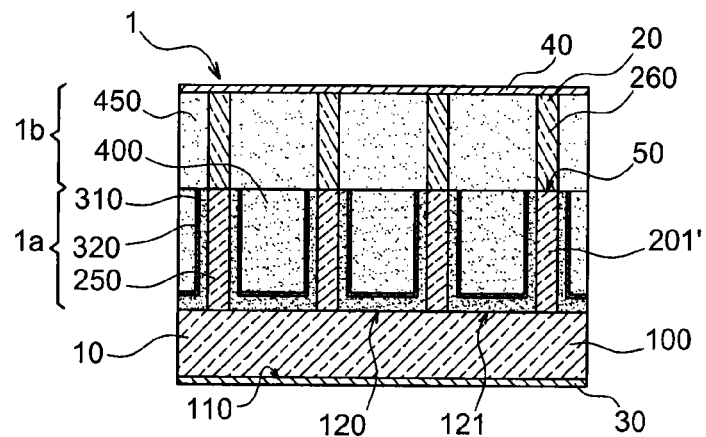
FIG. 7, illustrates a fourth embodiment of a semiconductor structure according to the invention, said semiconductor structure comprising nanowires having a first portion of a first type of conductivity and a portion of a second type of conductivity, the gate being present on a single portion of the nanowire, FIGS. 8 a) to e) illustrate a method of manufacture and emission of a semiconductor structure according to the fourth embodiment.
Figure 8A:
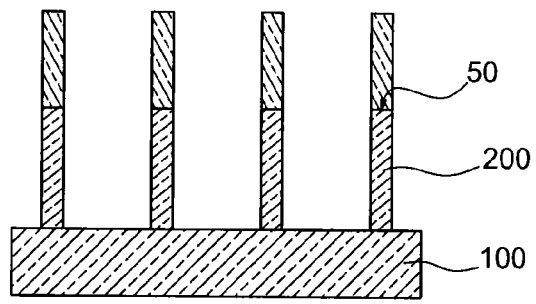
Figure 8B:
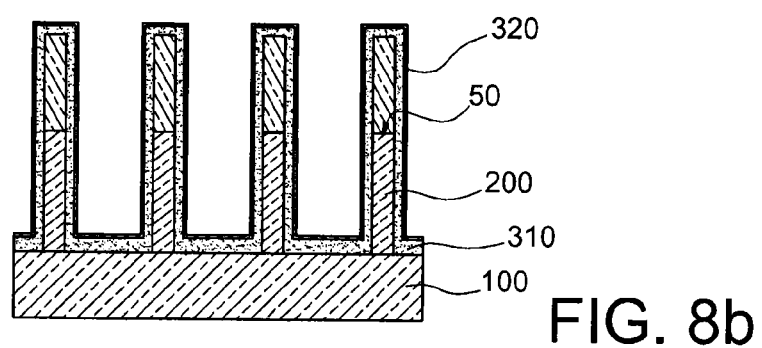
Figure 8C:
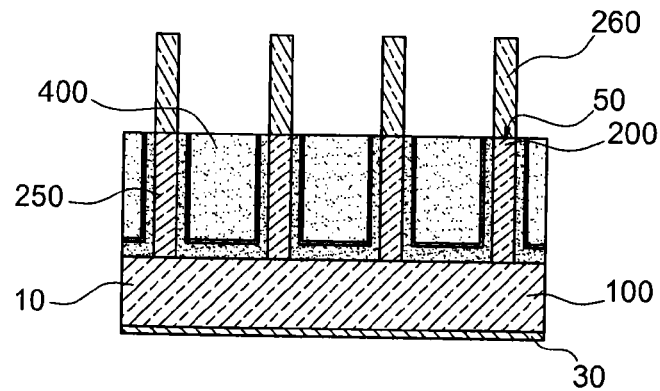
Figure 8D:
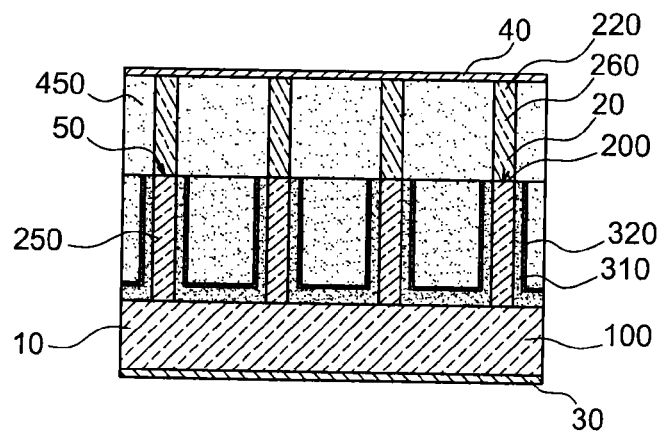
Figure 8E:
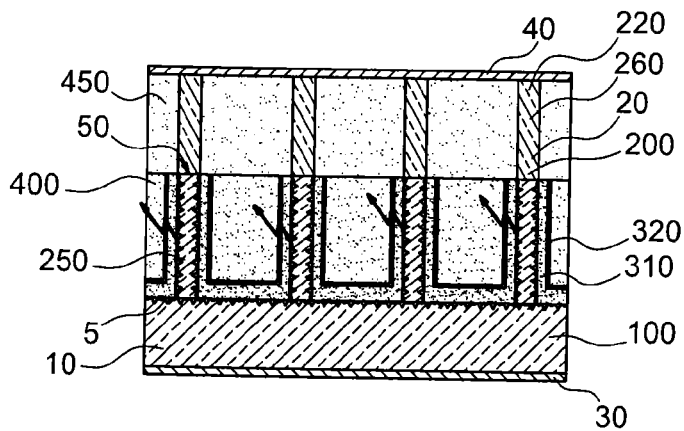

FIG. 7 is a schematic view in transversal section illustrating a semiconductor structure 1 according to a fourth embodiment. Such a semiconductor structure 1 differs from a semiconductor structure 1 according to the third embodiment in that the first portion 250 and the second portion 260 of each of the nanowires 200 are both made of a same material 201', 20 with an n type doping for the first portion 250 and a p type doping for the second portion 260 so as to form the junction 50, in that the layers of insulator material 310 and metal 320 are present uniquely on the first portion 250 of each of the nanowires 200, the filling material 400 being present around these same portions 250 of nanowires 200 and in that the semiconductor structure 1 has a doping polymer 450 filling the space between the nanowires 200 at the level of their second portion 260.

In this embodiment, the second semiconductor material 20 and the semiconductor material 201' of the first portion 250 of each of the nanowires 200 are both a wide band gap n type material with direct band gap in which the doping, for the second semiconductor material 20, has been inversed into a p type doping by an activation of the doping polymer 450.

The second semiconductor material 20 and the semiconductor material 201' of the first portion 250 of each of the nanowires 200 is preferentially zinc oxide (ZnO), but they may also be any wide band gap semiconductor material with direct band gap being able to have an n doping and in which the doping may be inversed by placing in contact with a doping polymer 450 and the activation of the latter.

The doping polymer 450 is a polymer comprising doping ions able to migrate into the semiconductor material contacting said polymer during an activation step, such as a thermal activation. This type of doping polymer 450 forms a doping material.

The method of manufacturing a semiconductor structure 1 according to the embodiment, as illustrated in FIGS. 8 a) to d), differs from a method of manufacturing a semiconductor structure 1 according to the third embodiment in that after the step of forming the nanowires 200, the method of manufacturing comprises the steps consisting in:
  depositing a filling layer 400 so that the space between the nanowires 200 is filled and so that a first portion 250 of each of the nanowires 200 is covered and that a second portion 260 of each of the nanowires 200 extends beyond said filling layer 400,
  eliminating, as illustrated in FIG. 8 c), the conductor layer 320 and the insulator layer 310 of the second portion 260 of each of the nanowires 200,
  depositing a layer of doping polymer 450, said layer of doping polymer 450 being deposited so that the second end 220 of each of the nanowires 200 is flush,
  carrying out an activation of the layer of doping material 450 so as to enable the doping of the second portion 260 of each of the nanowires 200 and thereby form the second semiconductor material 20,
  forming the first electrical contact 30 contacting the first face 110,
  forming the second electrical contact 40 contacting the second end 220 of each of the nanowires 200 to thereby obtain the semiconductor structure illustrated in FIG. 8 d).

The emission of light with a semiconductor structure 1 according to this embodiment is obtained, as illustrated in FIG. 8 e), in a similar manner to that of a semiconductor structure 1 according to the first embodiment.

Figure 9:
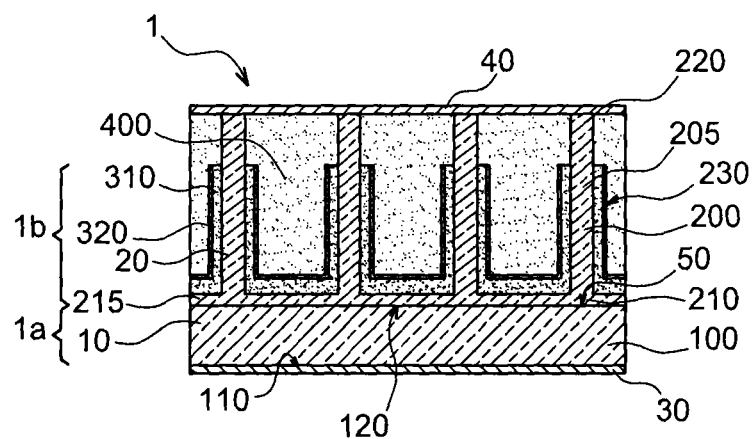
FIG. 9 illustrates a fifth embodiment according to the invention, said semiconductor structure comprising nanowires each comprising a portion of wetting layer and having a conductivity of another type as that of the substrate, FIGS. 10 a) to d) illustrate a method of manufacture and emission of a semiconductor structure according to the fifth embodiment, FIGS. 11 a) to c) illustrate embodiment variants of a semiconductor structure according to the invention, the semiconductor structure according to these embodiment variants comprising nanowires having at least one portion of nanowire of "core-shell" type, Identical, similar or equivalent parts of the different figures bear the same numerical references so as to make it easier to go from one figure to the next.
Figure 10A:
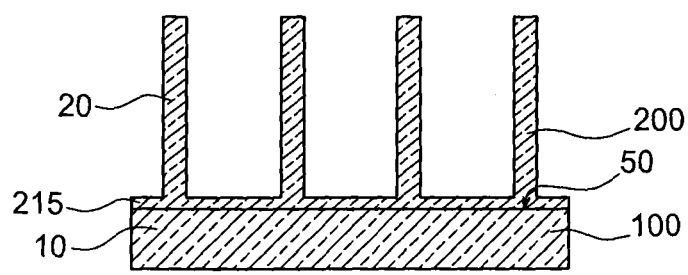
Figure 10B:
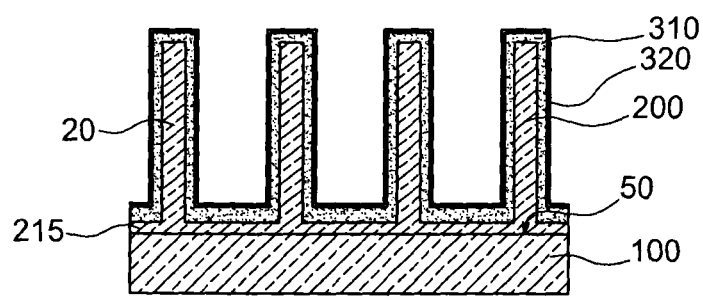
Figure 10C:
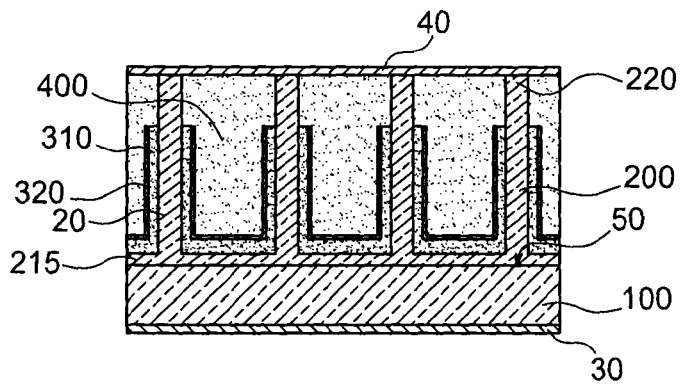
Figure 10D:
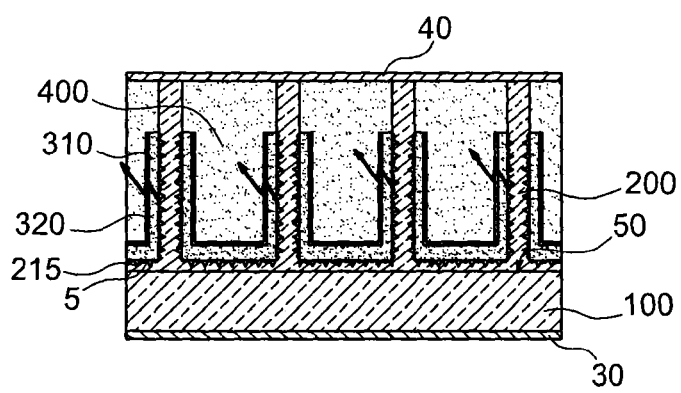

FIG. 9 is a schematic view in transversal section illustrating a semiconductor structure 1 according to a fifth embodiment. Such a semiconductor structure 1 differs from a semiconductor structure 1 according to the second embodiment in that each nanowire 200 comprises at its first end 210 a portion of wetting layer 215, the interface between said portion of wetting layer 215 and the second face 120 forming the junction 50, in that the insulator layer 310 is contacting the nanowires 200 without any contact with the second face 120 and in that the type of conductivity of the first and of the second semiconductor material 10, 20 is inversed, the first semi-conductor material 10 having a p type doping and the second semiconductor material 20 having an n type doping.

In this embodiment, nanowire 200 is taken to mean the body of the nanowire 205 itself, in other words the lengthened portion of the nanowire 200, and a portion of the layer of residual material 215 stemming from the growth of nanowires 200 and present on the second face 120, this layer being generally known as wetting layer. In fact, according to the type of growth of nanowires 200 used, as described in the article of I. C. ROBIN and his collaborators [5], there may exist, consecutively to the growth of the nanowire 200, a layer known as wetting. Such a layer, of the same type as the material forming the body 205 of each of the nanowires 200, has no discontinuity with the body 205 of each of the nanowires 200.

In this embodiment, the type of conductivity of the first and of the second semiconductor material 10, 20 being inversed, the types of electrical contact of the first and of the second electrical contact 30, 40 are preferentially inversed. Thus, the first electrical contact 30 is a p type electrical contact and the second electrical contact is preferentially an n type electrical contact.

The wetting layer according to this embodiment is of a thickness comprised between 10 nm and 150 nm with a preferred thickness substantially equal to 100 nm.

In this fifth embodiment, the nanowires 200 form the first portion 1b of the semiconductor structure 1 and the second face 120 forms the second portion 1a of the semiconductor structure 1.

The method of manufacturing a semiconductor structure 1 according to this embodiment, as illustrated in FIGS. 10 a) to d), differs from a method of manufacturing a semiconductor structure 1 according to the second embodiment by the step of forming nanowires 200, the step of forming nanowires 200 according to this embodiment being a formation step comprising the formation of a wetting layer concomitantly or previously to the formation of the bodies 205 of the nanowires 200.

The emission of light with a semiconductor structure 1 according to this fifth embodiment differs in the inversion of the polarization voltage of the junction 50. In fact, the junction 50 being inversed, a direct polarization requires that the second electrical contact 40 is polarized negatively relatively to the first electrical contact 30.

Figure 11A:
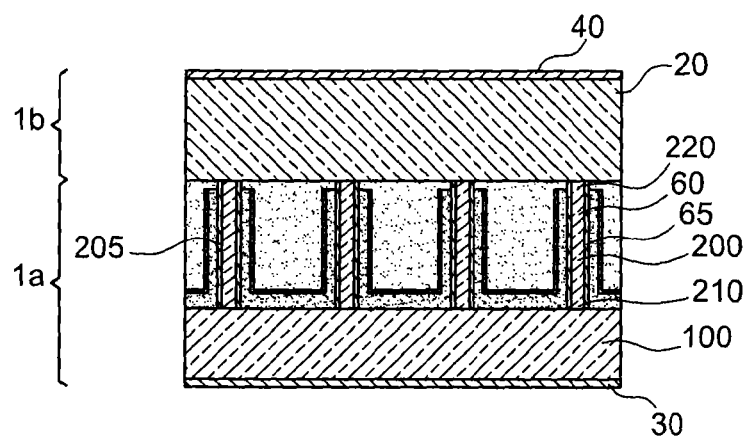
Figure 11B:
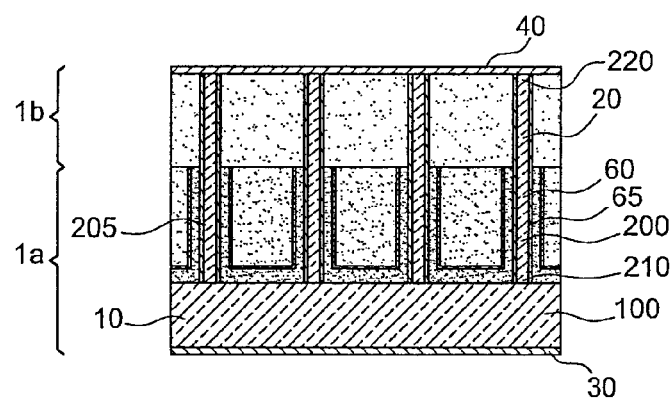
Figure 11C:
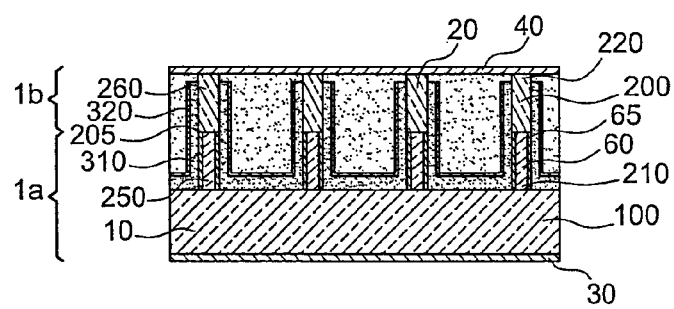

FIGS. 11 a) to c) illustrate possibilities of the invention for respectively the first, the fourth and the third embodiment. The semiconductor structures 1 according to these possibilities differ from the semiconductor structures 1 according to the embodiments from which they derive in that at least one portion of each of the nanowires 200 has a "core-shell" conformation.

"Core-shell" conformation is taken to mean a conformation of at least one portion of nanowire 200 constituted of at least two materials 50, 65, a material 60, known as core, forming the centre of the portion of nanowire 200 and a material 65, known as shell, forming the exterior contour of the portion of nanowire 200. Such a conformation may also have three or four materials according to a similar principle, the materials being laid out substantially concentrically with respect to the axis of the portion of nanowire 200.

Thus, according to a simple configuration of a single core material 60 and a single shell material 65 and in an aim of simple illustration of this possibility, the core material 60 may be zinc oxide (ZnO) or gallium nitride (GaN), the shell material 65 being able to be respectively, for these two materials, zinc manganese oxide (ZnMgO) and aluminium gallium nitride (AlGaN).

Such a layout enables a better confinement and limitation of the non-radiative recombination defects present at the level of the contour of each nanowire 200.

FIGS. 11 a) and b) illustrate more particularly a semiconductor structure 1 according to respectively the first and the fourth embodiment with nanowires 200 having a "core-shell" conformation over the whole of their body 205.

FIG. 11 c) illustrates for its part a semiconductor structure 1 according to the third embodiment with only the first portion 250 of each of the nanowires 200 having a conformation of the "core-shell" type.

The methods of manufacturing semiconductor structures 1 according to this possibility differ from methods of manufacturing semiconductor structures 1 according to the embodiment from which they are derived, in that the step of forming nanowires 200 comprises at least one step of growth of the core material 60 and a step of lateral growth of the shell material 65 around the core material 60.

The emission of light with semiconductor structures 1 according to this possibility is obtained in an identical manner to that of the semiconductor structures 1 according to the embodiments from which they are derived.

These three examples of semiconductor structures 1 according to the invention which can comprise nanowires 200 comprising at least one portion having a "core-shell" conformation are only given by way of indication and are thus non-limiting. In fact, all of the structures according to the embodiments described in this document may comprise nanowires 200 comprising at least one portion having a "core-shell" conformation, this portion being preferentially a portion of each nanowire 200 intended to emit light.

According to another possibility of the invention, not illustrated, each of the nanowires 200 may comprise a "quantum well" type conformation on at least one of these portions, said portion being preferentially chosen as being a light emitting portion. Thus, "quantum well" conformation is taken to mean the fact that said portions of nanowire 200 comprise a succession of materials having forbidden bands of different energies so as to create quantum confinement zones favouring, in the same way as for a "core-shell" conformation, radiative recombinations. The materials forming such a conformation may be, for example, of the same type as those used for a "core-shell" conformation, in other words zinc oxide (ZnO) or gallium nitride (GaN) for the "well" material, i.e. in which takes place the quantum confinement, and zinc manganese oxide (ZnMgO) or gallium aluminium nitride (GaAlN) for the "barrier" material, i.e. the material creating the potential barrier so as to confine the carriers in the "well" material. These examples are only given by way of illustration and are in no way limiting.

In the majority of embodiments described above, the substrate 100 has been chosen voluntarily as having an n type conductivity, it may also be envisaged to inverse the type of conductivity of all of the materials composing 10, 20, 201, 201', 60, 65, the semiconductor structures 1 described, the substrate 100 then having a p type conductivity and the polarization voltages having to be inversed, without going beyond the scope of the invention.

Similarly, the order of the steps of the manufacturing methods described above is for a part of these step purely arbitrary, thus it may for example be envisaged, without modification of the semiconductor structures 1 obtained by such methods of manufacturing and without going beyond the scope of the invention, to carry out the step of forming the first contact 30 before the step of forming the nanowires 200.

Similarly, if in all of the embodiments, the micro- or nano-structures are formed by nanowires 200, it is also possible to form such micro- or nano-structures by semi-conductor pillars having a shape other than that of nanowires or by a series of semiconductor strips parallel to each other of which one of the longitudinal sides is contacting the second face 120, or by any other type of micro- or nano-structure having at least one reduced dimension along one of the directions substantially parallel to the second face 120 so as to form a 2D or preferentially 1D micro- or nano-structure.

REFERENCES

[1] S. J. Jiao et Al. Applied Physics Letters 88 (2006) pages 031911 to 031913.
[2] H. Ohta et Al, Applied Physics Letters 83, (2003) pages 1029 to 1031.
[3] J. Simon et Al, Science 327 (2010) pages 60 to 64.
[4] I. C. Robin et Al, Micoelectronics Journal, 40 (2009) pages 250 to 252.
[5] I. C. Robin et Al, Appl. Phys. Lett., 91, (2007) pages 143120 to 143122.

The invention claimed is:

1. A semiconductor structure for emitting light, comprising:
    a substrate made of a first semiconductor material having a first type of conductivity, the substrate including a first face and a second face;
    a first electrical contact on the first face;
    a second semiconductor material, having a second type of conductivity forming a first portion of the semiconductor structure and in electrical contact with a second portion of the semiconductor structure having the first conductivity so as to form a junction;
    a second electrical contact electrically connected with the second semiconductor material;
    a polarizer configured to polarize at least one predetermined portion of the semiconductor structure among the first portion and the second portion, the polarizer being laid out so that its polarization leads to an inversion of type of carriers in the predetermined portion by injection into the predetermined portion of majority carriers of the other portion among the first portion and the second portion, so as to move the junction in the predetermined portion; and
    a plurality of micro- or nano-structures each including a first end and a second end, each of the first ends being connected to the second face, wherein each micro- or nano-structure comprises the first portion; and wherein the polarizer is configured to polarize the second face of the substrate which is left free by the micro- or nano-structures and to polarize at least a part of each micro- or nano-structure.

2. A semiconductor structure according to claim 1, wherein the polarizer comprises an insulator layer contacting the predetermined portion of the semiconductor structure to be polarized, and a conductor layer on the insulator layer.

3. A semiconductor structure according to claim 2, wherein the insulator layer contacts zones of the second face of the substrate which are left free by the micro- or nano-structures, and contacts at least one portion of each micro- or nano-structure.

4. A semiconductor structure according to claim 2, wherein the conductor layer is adapted to be at least partially transparent to a wavelength at which the semiconductor structure is intended to emit.

5. A semiconductor structure according to claim 2, wherein the insulator layer is made of a material selected from the group of silicon dioxide ($SiO_2$), and high-k dielectrics or hafnium dioxide ($HfO_2$).

6. A semiconductor structure according to claim 1, wherein each micro- or nano-structure has at least one reduced dimension along one of directions substantially parallel to the second face of the substrate to form a 2D, or 1D, micro- or nano-structure.

7. A semiconductor structure according to claim 1, wherein each micro or nano-structure is a semiconductor nanowire.

8. A semiconductor structure according to claim 1, wherein each micro- or nano-structure has a conductivity of same type as that of the first semiconductor material to form the second portion, the second end of each of the micro- or nano-structures contacting the second semiconductor material.

9. A semiconductor structure according to claim 1, wherein each micro or nano-structure comprises:
    a first portion comprising the first end, and having a conductivity of same type as that of the first semiconductor material to form the second portion, and
    a second portion comprising the second end, and being made from the second semiconductor material to form the first portion.

10. A semiconductor structure according to claim 1, wherein each micro- or nano-structure is entirely made from the second semiconductor material to form the first portion.

11. A semiconductor structure according to claim 10, wherein each micro- or nano-structure comprises a fraction of a layer contacting the substrate, the fraction of the layer forming the first end of the micro- or nano-structure.

12. A semiconductor structure according to claim 6, wherein at least one portion of each nanowire comprises a conformation of core-shell type, in which the portion of the nanowire comprises at least two semiconductor materials, of one core material forming a center of the portion of the nanowire and an other shell material surrounding the core material to form an exterior contour of the portion of nanowire.

13. A semiconductor structure according to claim 7, wherein at least one portion of each nanowire comprises a conformation of core-shell type in which the portion of the nanowire comprises at least two semiconductor materials, of one core material forming a center of the portion of the nanowire and an other shell material surrounding the core material to form an exterior contour of the portion of nanowire.

14. A semiconductor structure according to claim 13, wherein each micro or nano-structure comprises:
    a first portion comprising the first end, and having a conductivity of same type as that of the first semiconductor material to form the second portion, and
    a second portion comprising the second end, and being made from the second semiconductor material to form the first portion,
    wherein each nanowire has a single portion of nanowire comprising a core-shell conformation, the portion of nanowire being a portion selected from the group of the first portion and the second portion.

15. A semiconductor structure according to claim 1, wherein the junction is a heterojunction.

16. A semiconductor structure according to claim 1, wherein the predetermined portion among the first and second portion has a conductivity in which the majority carriers are electrons and is made of a semiconductor material having an n type doping, the semiconductor material being selected from the group of zinc oxide (ZnO), zinc manganese oxide (ZnMgO), gallium nitride (GaN), and aluminium gallium nitride (AlGaN).

17. A semiconductor structure according to claim 1, wherein the predetermined portion among the first and second portion has a conductivity in which majority carriers are holes and is made of a semiconductor material having a p type doping, the semiconductor material being selected from the group of gallium nitride (GaN), zinc selenide (ZnSe) and zinc telluride (ZnTe).

18. A method for manufacturing a semiconductor structure according to claim 1, the method comprising:
    providing a substrate made of a first semiconductor material having a first type of conductivity, the substrate having a first face and a second face;
    forming a first electrical contact on the first face;
    forming a plurality of micro- or nano-structures on the second face, each of the micro- or nano-structures including a first end and a second end with each of the first ends connected to the second face, wherein each micro- or nano-structure comprising at least one portion made of a second semiconductor material including, or configured to include by action of a doping material, a conductivity of a second type to form a first portion of the semiconductor structure with the substrate and/or another portion of each of the micro- or nano-structures forming a second portion of the semiconductor structure, or each micro- or nano-structure having the first type of conductivity and forming at least partially a second portion of the semiconductor structure;
    forming a polarizer configured to polarize at least one predetermined portion among the first and the second portion, the polarizer being laid out so that its polarization leads to an inversion of type of carriers in the predetermined portion;
    depositing, if each micro- or nano-structure has the first type of conductivity and forms at least partially the second portion, a second semiconductor material to form the first portion; and
    forming a second electrical contact contacting the second semiconductor material.

19. A method for manufacturing according to claim 18, wherein the method for manufacturing is a method for manufacturing a semiconductor structure, the forming a polarizer comprising:

depositing an insulator layer on the zones of the second face which are left free by the micro- or nano-structures, and on at least one portion of each micro- or nano-structure; and depositing, on the insulator layer, a conductor layer.

20. A method for manufacturing according to claim 19, wherein the method for manufacturing comprises, after the forming a polarizer and before the forming the second electrical contact:

eliminating a part of the insulator layer and a part of the conductor layer present on each of the micro- or nano-structures at a level of their second end and at least at a level of a circumference near to the second end on each of the micro- or nano-structures;

depositing a filling material so that a space between the micro- or nano-structures is at least partially filled and that each of the micro- or nano-structures has at least one covered portion.

21. A method for manufacturing according to claim 19, further comprising, after the forming a polarizer and before the forming the second electrical contact:

depositing a filling layer so that a space between the micro- or nano-structures is filled and so that a first portion of each of the micro- or nano-structures is covered and a second portion of each of the micro- or nano-structures extends beyond the filling layer;

eliminating a part of the insulator layer and a part of the conductor layer of the second portion of each of the micro- or nano-structures;

depositing a layer of doping material, or a polymer containing doping ions, the layer being deposited so that the second end of each of the micro- or nano-structures is flush;

carrying out an activation of the layer to enable doping of the second portion of each of the micro- or nano-structures.

22. A semiconductor structure for emitting light, comprising:

a substrate made of a first semiconductor material having a first type of conductivity, the substrate including a first face and a second face;

a first electrical contact on the first face;

at least one second semiconductor material, having a second type of conductivity forming a first portion of the semiconductor structure and in electrical contact with a second portion of the semiconductor structure having the first conductivity so as to form a junction;

a second electrical contact electrically connected with the second semiconductor material;

a polarizer configured to polarize at least one predetermined portion of the semiconductor structure among the first portion and the second portion, the polarizer being laid out so that its polarization leads to an inversion of type of carriers in the portion by injection into the predetermined portion of majority carriers of the other portion among the first portion and the second portion, so as to move the junction in the predetermined portion; and a plurality of micro- or nano-structures interposed between the substrate and the at least one second semiconductor material, each micro- or nano-structures including a first end and a second end, each of the first ends being connected to the second face, each of the second end contacting the second semiconductor material so as to form the junction wherein each micro- or nano-structure has the first type of conductivity, and wherein the polarizer is configured to polarize the second face of the substrate which is left free by the micro- or nano-structures and on at least a part of each micro- or nanostructure.

* * * * *